United States Patent [19]

Bouquet

[11] 4,430,577
[45] Feb. 7, 1984

[54] HIGH VOLTAGE ELECTROMAGNETIC PULSE GENERATOR

[75] Inventor: Gerard Bouquet, Pessac, France

[73] Assignee: Commissariat a l'Energie Atomique, France

[21] Appl. No.: 463,134

[22] Filed: Feb. 2, 1983

[30] Foreign Application Priority Data

Feb. 4, 1982 [FR] France ................ 82 01812

[51] Int. Cl.³ .................................................. H03K 3/00
[52] U.S. Cl. ........................................ 307/108; 315/39
[58] Field of Search ............ 307/96, 106, 108, 132 E, 307/109; 315/39

[56] References Cited

U.S. PATENT DOCUMENTS

| | | | |
|---|---|---|---|
| 3,071,710 | 1/1963 | Fischer | 315/39 |
| 3,078,386 | 2/1963 | Fischer | 315/39 |
| 3,085,176 | 4/1963 | Fischer | 315/39 |
| 3,356,869 | 12/1967 | Hilton et al. | 307/106 X |
| 3,478,231 | 11/1969 | Knoepfel et al. | 307/106 X |
| 3,484,619 | 12/1969 | Proud, Jr. | 307/106 |
| 3,521,121 | 7/1970 | Proud, Jr. | 307/106 X |
| 3,564,277 | 2/1971 | Maguire | 307/106 |
| 3,611,210 | 10/1971 | Theodore | 307/106 X |
| 3,748,528 | 7/1973 | Cronson | 307/106 X |
| 4,003,007 | 1/1977 | Stewart | 307/106 X |
| 4,104,556 | 8/1978 | Proud, Jr. et al. | 307/106 X |
| 4,104,557 | 8/1978 | Proud, Jr. | 307/106 X |
| 4,104,558 | 8/1978 | Proud, Jr. et al. | 307/106 X |
| 4,367,415 | 1/1983 | Brünner | 307/106 |

OTHER PUBLICATIONS

Pulfrey–"A Generator of High Voltage Pulses with Subnanosecond Risetime and Adjustable Duration", Journal of Scientific Instruments, Feb. 10, 1969.
Coupain and Hellegouarch, "Générateur d'Impulsion 200 kV à Temps de Montée Rapide", Techniques CEM No. 100/101, (12/77).
Bacchi & Blanchet "Générateurs d'Impulsions Haute Tension", L'Onde Électrique, vol. 48, No. 494, Mar. 1968.

*Primary Examiner*—E. A. Goldberg
*Assistant Examiner*—Derek Jennings

[57] ABSTRACT

The invention relates to a high voltage electromagnetic pulse generator.

This generator comprises a capacitor having an axis of revolution, disposed about an internal conductor and charged by means of a high voltage direct current power supply, a conical spark gap, whose axis of revolution coincides with that of the capacitor, having first and second electrodes and used for discharging the capacitor, a ballast resistor having an axis of revolution, connected in series with the spark gap in such a way that the first electrode is connected to the high voltage terminal of the power supply and the second electrode to the earth of said power supply via the ballast resistor and the internal conductor and electromagnetic control means for the spark gap, the capacitor, spark gap and ballast resistor forming with the internal conductor a coaxial line having a constant impedance along the line.

7 Claims, 3 Drawing Figures

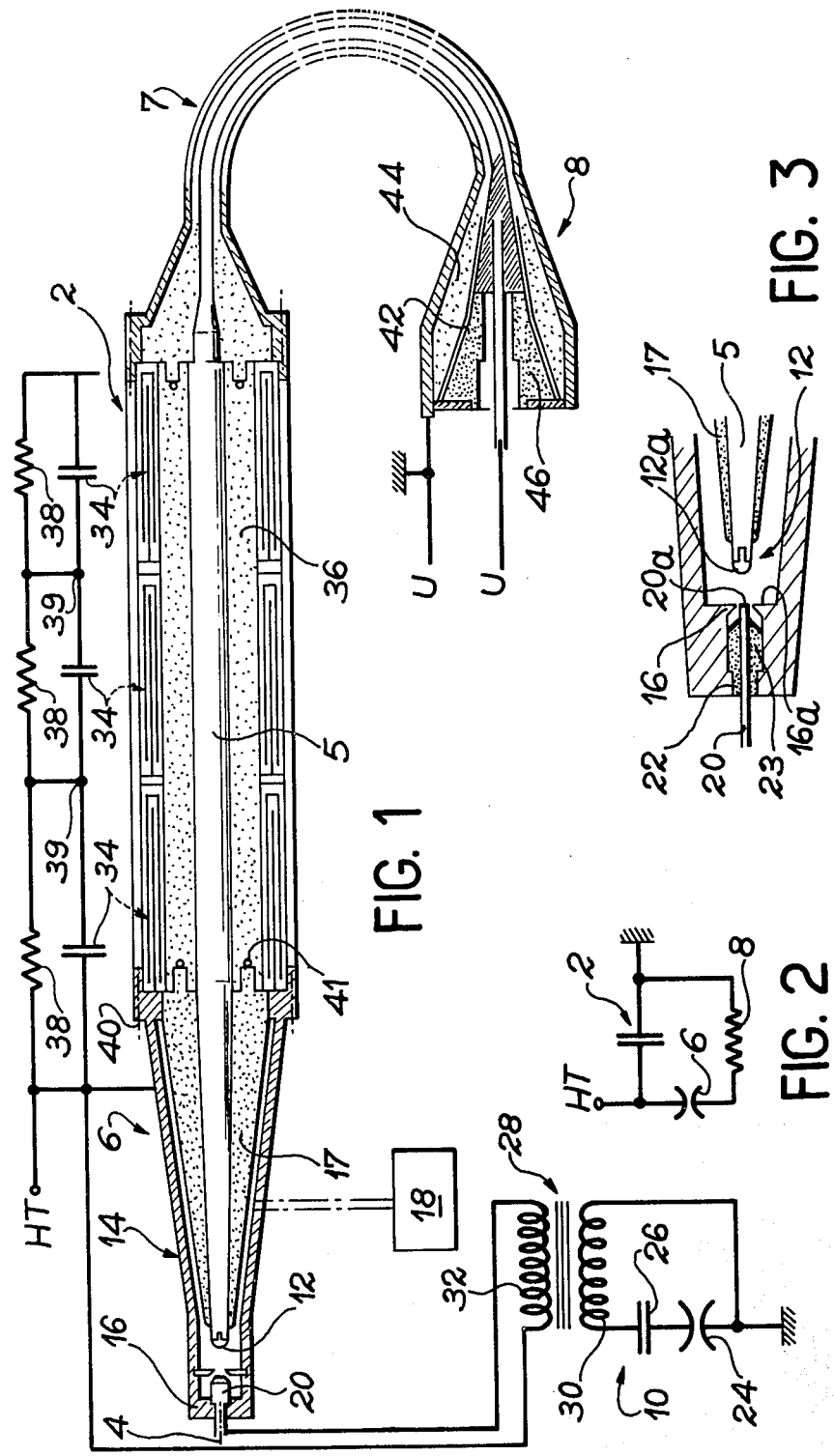

HIGH VOLTAGE ELECTROMAGNETIC PULSE GENERATOR

BACKGROUND OF THE INVENTION

The present invention relates to a high voltage electromagnetic pulse generator.

This pulse generator can in particular be used for testing the behaviour of certain devices, such as electronic components, under high voltage pulses, such as e.g. pulses of 30 to 300 kV, with leading fronts lasting less than 5 ns.

The presently known electromagnetic pulse generators do not permit such an application, in view of the existence of an excessively high overall choke or inductor, which is constituted by the individual chokes of the various components of the generator, as well as the connecting chokes resulting from the interconnection of these various components.

BRIEF SUMMARY OF THE INVENTION

The present invention relates to a high voltage electromagnetic pulse generator making it possible to eliminate the effect of this choke. This generator can in particular be used for the purpose described hereinbefore.

More specifically, the invention relates to a high voltage electromagnetic pulse generator, wherein it comprises a capacitor having an axis of revolution, disposed around an internal conductor having an axis of revolution coinciding with that of the capacitor, whereby the latter can be charged by a direct current power supply, a conical spark gap, whose axis of revolution can coincide with that of the capacitor having at least two electrodes, namely an external electrode and an internal electrode, and making it possible to discharge the capacitor in pulse-like manner, a ballast resistor having an axis of revolution, connected in series with the spark gap in such a way that the external electrode of the spark gap is directly connected to the high voltage terminal of the power supply and the internal electrode of the spark gap is connected to the earth of said power supply, via the internal conductor and the ballast resistor, as well as spark gap control means, the capacitor, the spark gap and the ballast resistor of said generator forming with the internal conductor a coaxial line having a constant impedance along said line.

The impedance of this line is, for example, close to 50 ohms, which makes it possible to overcome the problems connected with chokes. Thus, this generator can produce regulatable pulses having a voltage between 30 and 300 kV with a leading front lasting less than 5 ns.

According to a preferred embodiment of the generator according to the invention, the end of the internal electrode facing the external electrode has a convex shape.

According to anothe preferred embodiment of the generator according to the invention, the part of the external electrode facing the end of the internal electrode has a planar shape.

According to another preferred embodiment of the invention, the capacitor is arranged around an insulation cylindrical support in which is housed the internal conductor, and the assembly constituting a coaxial line.

According to another preferred embodiment of the generator according to the invention, the load resistor comprises a sheet of aqueous electrolyte, whose thickness varies in an inversely proportional manner with the radius of said sheet.

According to another embodiment of the invention, the generator comprises a gate placed in a bore made in the planar part of the external electrode. In this embodiment, for example, the spark gap control means comprise another capacitor, which can be charged by means of another direct current power supply, another spark gap making it possible to discharge this other capacitor in pulse-like manner and an insulating transformer, whose primary is connected between said other capacitor and the earth of said other power supply and whose secondary is connected between the external electrode and the gate.

BRIEF DESCRIPTION OF THE DRAWINGS

The invention is described in greater detail hereinafter relative to non-limitative embodiments and the attached drawings, wherein show:

FIG. 1 diagrammatically a sectional view of a pulse generator according to the invention.

FIG. 2 a block diagram of the pulse generator discharge circuit of FIG. 1.

FIG. 3 diagrammatically, a sectional view of the pulse generator spark gap of FIG. 1.

DETAILED DESCRIPTION OF THE PREFERRED EMBODIMENTS

According to the invention the electromagnetic pulse generator comprises a capacitor 2 having an axis of revolution 4 and positioned around an internal conductor 5 having an axis of revolution coinciding with that of the capacitor. The generator also comprises a conical spark gap 6, whose axis of revolution coincides with that of the capacitor, and a ballast resistor 8 having an axis of revolution, which may or may not coincide with the axis of revolution 4 of the capacitor. For practical reasons, these various components of the pulse generator must be dismantlable.

The generator also comprises a high direct current power supply connected to the terminals of capacitor 2 and permitting the charging of the latter. The pulse-like discharge of capacitor 2 is performed by means of spark gap 6, whose control takes place by means of a system 10.

According to the invention, capacitor 2, spark gap 6 and load resistor 8 define with internal conductor 5 a coaxial line having a constant impedance along said line. For example, the impedance of the line is approximately 50 ohms.

When it is desired to respect to a minimum the principle of impedance matching along the coaxial line forming the generator, it is clear that this is impossible in the region of the spark gap where the spark is formed. In order to respect this principle it is necessary to give said regions the smallest possible dimensions and this impedance problem can be solved by a conical spark gap.

The ballast resistor 8 is connected to the assembly formed by spark gap 6 and capacitor 8, either directly by means or screws, or via a cable 7, in the manner shown in FIG. 1. The cable has the same impedance as the aforementioned coaxial line.

From the electrical connections standpoint, the ballast resistor, as shown in FIG. 2, is connected in series with the spark gap 6, and the assembly constituted by the resistor and the spark gap is connected to the terminals of capacitor 2, i.e. to the terminals of the high direct current power supply According to the invention, the spark gap 6 is constituted by at least two electrodes, namely an internal electrode 12 and an external electrode 14, serving as a tight envelope, which is made from metal. In view of the fact that the voltages to which the spark gap can be exposed are very high, the length of the external electrode 14 must also be considerable.

Preferably, the end 12a of internal electrode 12, facing external electrode 14, has a convex, e.g. hemispherical shape, whilst the part 16 of the external electrode, facing said end 12a, has a planar shape, in the manner illustrated in FIG. 3.

The internal electrode 12, located in a conical insulating part 17, is connected to the earth of the high voltage power supply via ballast resistor 8, and the external electrode 14 is connected to the high voltage terminal of said power supply (FIG. 1).

Spark gap 6 is of the pressurized type. Gas is supplied to the spark gap by means of a suitable regulatable system 18. As a function of the desired voltage response, the gases used are either sulphur hexafluoride, or nitrogen. The latter can be compressed through pressures down to 25 bars, so that the external electrode 14 serving as the envelope must be able to withstand such pressures. In this type of spark gap, sparkover is produced by the depressurization of the spark gap.

In view of the use of high gas pressures in the spark gap and the weak tensile behaviour of the insulating materials which can be used for forming the insulating part 17 of said spark gap, (plastics, ceramics), it is preferable to make the materials work under compression. This is in particular obtained by using a conical spark gap. Thus, the pressure of the gas in the space between external electrode 14 and insulating part 17 leads to the buttressing of the insulating part against electrode 14, so that the insulating material constituting part 17 works in the desired sense.

Studies have shown that the sparkover of spark gap 6 does not always take place axially, i.e. between end 12a of electrode 12 and the planar part 16 of electrode 14. Thus, sparkover sometimes takes place laterally in the space between external electrode 14 and insulating part 17. As a result of the use of a conical spark gap it is possible to obtain a space of significant length, which makes it possible to obviate such a sparkover.

Moreover, it is possible to use a spark gap 6 of the triode type having a gate 20, in the manner shown in FIG. 3, as well as electrodes 12 and 14. Gate 20 is placed in a bore 22 made in the planar part 16 of external electrode 14 and is disposed in such a way that end 20a of said gate is flush with the inner part 16a of the external electrode. In order to prevent any gas leak from the inside to the outside of the spark gap an insulating material 23 fills bore 22.

As has been stated hereinbefore, the control of the spark gap and in particular the triode-type spark gap is provided by means of a system 10. This electromagnetic-type system 10 comprises a switch, such as for example a spark gap 24, connected to the terminals of a second direct current power supply, a capacitor 26, which can be charged by said second power supply, and an insulating transformer 28, which can also constitute a voltage raising means, whose primary 30 is connected between capacitor 26 and the earth of the second power supply and whose secondary 32 is connected between external electrode 14 and gate 20.

On controlling the closing of switch 24, capacitor 26 discharges across the primary 30 of transformer 28. The voltage produced leads to a spark between gate 20 and external electrode 14 in the transformer secondary 32 and this causes a spark between end 12a of internal electrode 12 and the planar part 16 of external electrode 14. The sparkover of spark gap 6 then produces the pulse-type discharge of capacitor 2 giving rise to high voltage output pulses.

The use of such a control system makes it possible to produce reproducible signals, both from the shape and amplitude standpoints, as from the standpoint of the rise rate of said signals.

According to the invention, capacitor 2 of the generator can be formed either by a single capacitor, or by several capacitors 34, connected in series and/or in parallel. This or these capacitors have the shape of hollow cylinders, disposed around a cylindrical insulating support 36, e.g. made from PVC, in which is housed the internal conductor 5. The assembly formed by the capacitor, the cylindrical support and the internal conductor, constitutes a coaxial line, whose impedance is, for example, close to 50 ohms.

On using several capacitors connected in series, ballast resistors 38 should be provided and each of these is connected in parallel with the corresponding capacitor 34, as shown in the upper part of FIG. 1. These resistors are used for imposing adequate voltages at intermediate points 39.

As has been stated hereinbefore, the various components constituting the pulse generator must be dismantlable, particularly with respect to the assembly formed by the capacitor and the spark gap. Screws such as 40 make it possible to fix the spark gap to the capacitor.

Moreover, gaskets such as 41 must be provided, in order to prevent a possible sparkover between the earth and the high voltage, i.e. between the capacitor and the internal conductor.

The ballast resistor 8 must comprise an aqueous electrolyte sheet 42, which is of revolution and is inserted between the two insulating parts 44 and 46. The electrolyte chosen is, for example, a sodium chloride solution.

To ensure that the power dissipated in the electrolyte is constant, the thickness of the sheet varies in inversely proportional manner to the radius of the sheet. The generatrix of this sheet of revolution is determined in such a way that impedance matching is maintained from one end to the other of the ballast resistor. For example, the impedence of this electrolyte sheet is equal to 50 ohms.

Obviously this is only an exemplified embodiment of the ballast resistor and the latter can in particular be constituted by several seriesparallel connected commercial carbon resistors.

In the application of the pulse generator in the testing of electronic components, the latter must be connected in parallel with ballast resistor 8, i.e. to the output terminals of the generator designated U, by means of a specific connector, whose structure is a function of the components to be tested.

An exemplified embodiment of the pulse generator as described hereinbefore will now be provided. Capacitor 2 can be formed from three series-connected, elementary capacitors having a capacitance of 180 nF and having and internal diameter of 200 mm, an external diameter of 255 mm and a length of 306 mm, said capacitors having a voltage response at least equal to 50 kV. Resistor 38 connected to the terminals of each of the elementary capacitors is equal to 250 M$\Omega$.

The spark gap length can be 400 mm.

With regards to the control system 10 of the triode-type spark gap 6, the voltage supplied by the second power supply is equal to 7 kV, the capacitance of capacitor 24 equal to 100 nF and the number of turns of the voltage raising transformer primary and secondary are respectively equal to 15 and 40.

What is claimed is :

1. A high voltage electromagnetic pulse generator, wherein, it comprises a capacitor having an axis of revolution, disposed around an internal conductor having an axis of revolution coinciding with that of the capacitor, whereby the latter can be charged by a direct current power supply, said direct current power supply having a high voltage terminal and an earth, a conical spark gap, whose axis of revolution can coincide with that of the capacitor having at least two electrodes, namely an external electrode and an internal electrode, and making it possible to discharge the capacitor in pulse-like manner, a ballast resistor having an axis of revolution, connected in series with the spark gap in such a way that the external electrode of the spark gap is directly connected to the high voltage terminal of the power supply and the internal electrode of the spark gap is connected to the earth of said power supply, via the internal conductor and the ballast resistor, as well as spark gap control means, the capacitor, the spark gap and the ballast resistor of said generator forming with the internal conductor a coaxial line having a constant impedance along said line.

2. A pulse generator according to claim 1, wherein the end of the internal electrode, facing the external electrode, has a convex shape.

3. A pulse generator according to claim 2, wherein that part of the external electrode facing the end of the internal electrode has a planar shape.

4. A pulse generator according to claim 1, wherein the capacitor is disposed around a cylindrical insulating support, which houses the internal conductor, the assembly constituting a coaxial line.

5. A pulse generator according to claim 1, wherein the ballast resistor is constituted by an aqueous electrolyte sheet, whose thickness varies in inversely proportional manner to the radius of the sheet.

6. A pulse generator according to claim 3, wherein it comprises a gate placed in a bore made in the planar part of the external electrode.

7. A pulse generator according to claim 6, wherein the spark gap control means comprise another capacitor, which can be charged by means of another direct current power supply, another spark gap making it possible to discharge this other capacitor in pulse-like manner and an insulating transformer, whose primary is connected between said other, capacitor and the earth of said other power supply and whose secondary is connected between the external electrode and the gate.

* * * * *